United States Patent
Darvishi et al.

(10) Patent No.: US 10,396,748 B2
(45) Date of Patent: Aug. 27, 2019

(54) LINEAR, LOW NOISE, HIGH Q AND WIDELY TUNABLE NOTCH FILTER

(71) Applicant: Avago Technologies General IP (Singapore) Pte. Ltd., Singapore (SG)

(72) Inventors: Milad Darvishi, Irvine, CA (US); Hooman Darabi, Laguna Niguel, CA (US); Arya Reza Behzad, Los Altos, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 28 days.

(21) Appl. No.: 15/730,643

(22) Filed: Oct. 11, 2017

(65) Prior Publication Data

US 2019/0109575 A1  Apr. 11, 2019

(51) Int. Cl.
| | | |
|---|---|---|
| *H03H 1/00* | (2006.01) |
| *H03H 2/00* | (2006.01) |
| *H03H 7/01* | (2006.01) |
| *H03H 7/12* | (2006.01) |
| *H04J 1/04* | (2006.01) |

(52) U.S. Cl.
CPC .............. *H03H 7/01* (2013.01); *H03H 2/008* (2013.01); *H03H 7/12* (2013.01); *H04J 1/045* (2013.01); *H03H 2001/0014* (2013.01); *H03H 2007/013* (2013.01); *H03H 2210/025* (2013.01)

(58) Field of Classification Search
CPC ............ H03H 7/01; H03H 2/008; H03H 7/12; H03H 2001/0014; H03H 2007/013; H03H 2210/0025; H04J 1/045
USPC ......................................................... 333/180
See application file for complete search history.

(56) References Cited

U.S. PATENT DOCUMENTS

2016/0336915 A1* 11/2016 Kavousian ........... H03H 7/0123
2017/0026031 A1*  1/2017 Levesque ............ H03H 7/0153

* cited by examiner

*Primary Examiner* — Robert J Pascal
*Assistant Examiner* — Kimberly E Glenn
(74) *Attorney, Agent, or Firm* — Morgan, Lewis & Bockius LLP

(57) ABSTRACT

A linear, low noise, high quality factor (Q) and widely tunable notch filter circuit includes one or more first reactive elements coupled between a first filter node and a first node. The notch filter circuit further includes a multi-branch circuit having multiple parallel branches and coupled between the first node and a second node. Each branch of the multi-branch circuit includes at least a switch coupled to a variable capacitor. A notch frequency of the notch filter circuit is tunable by adjusting a capacitance of the variable capacitor.

20 Claims, 10 Drawing Sheets

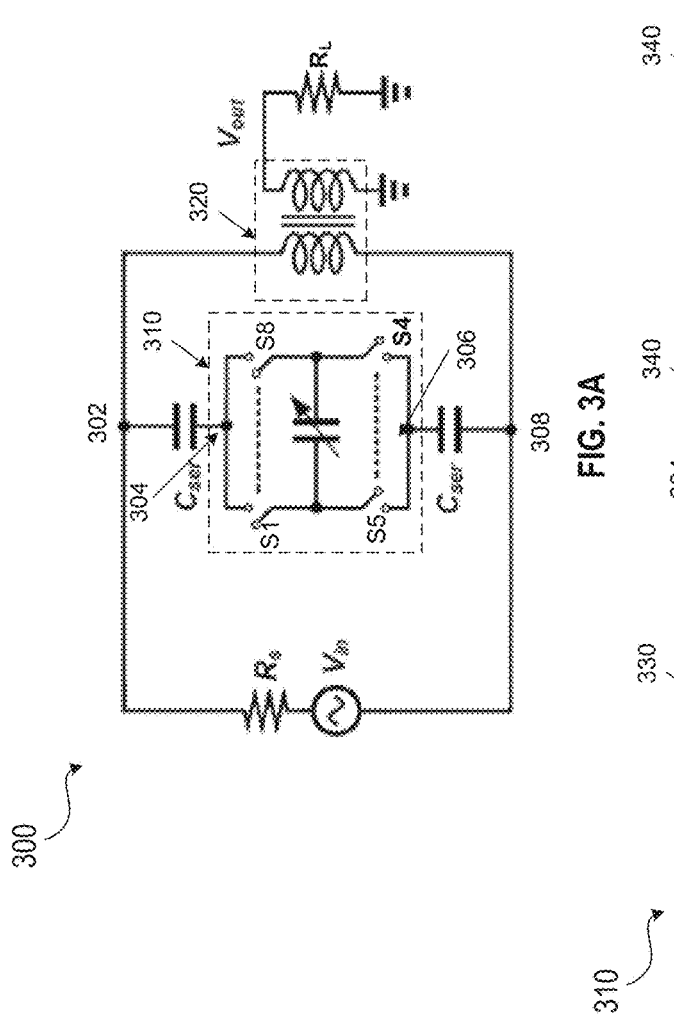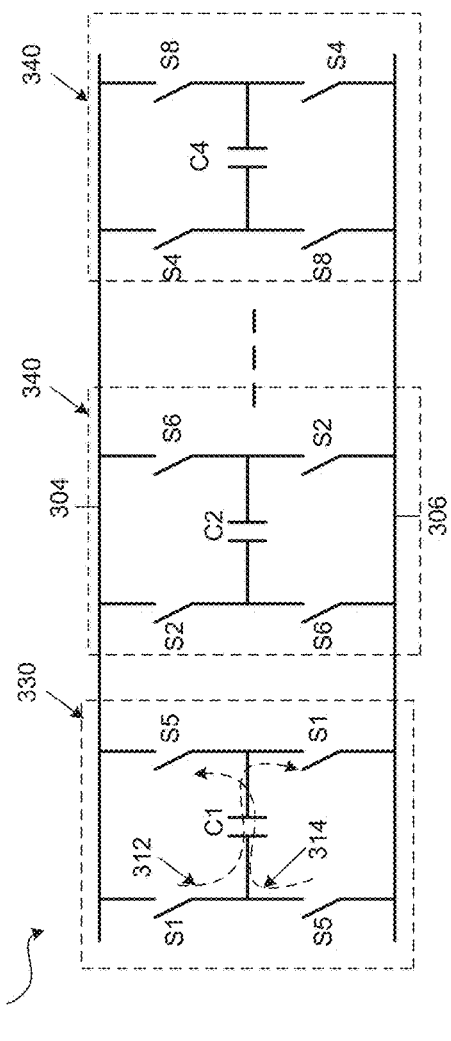
FIG. 3A
FIG. 3B

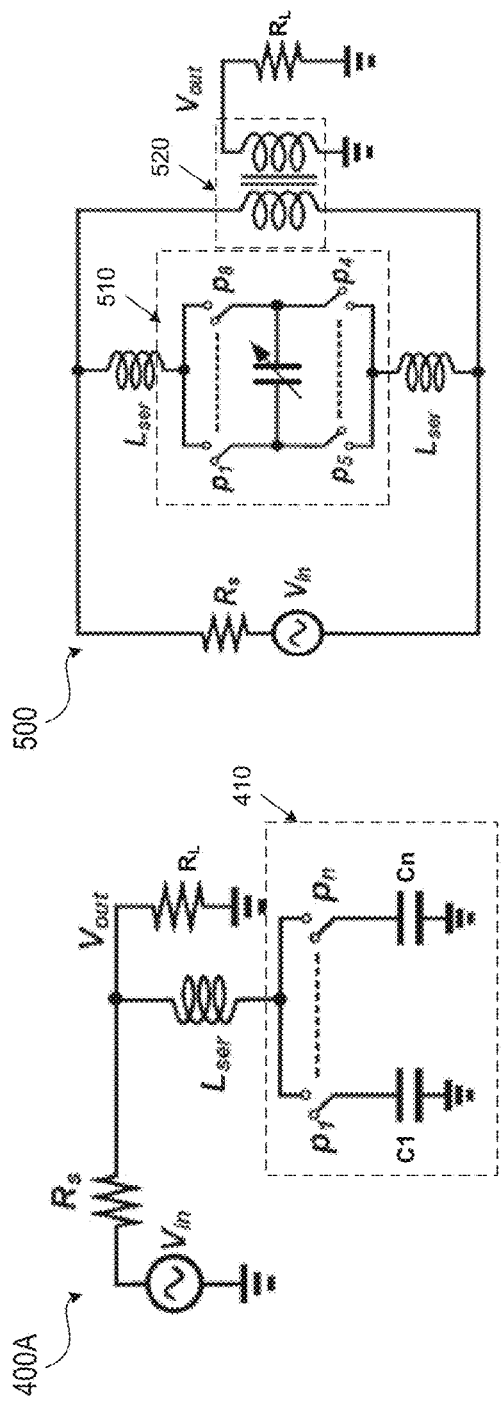
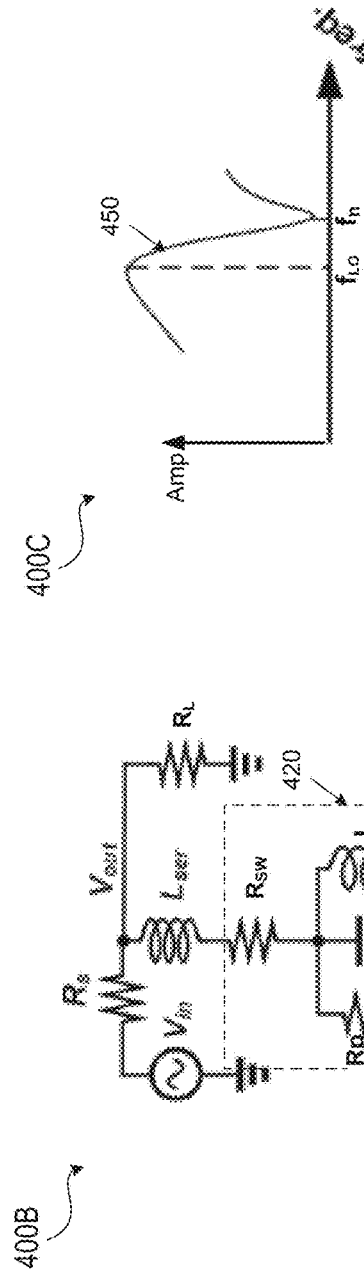
FIG. 5
FIG. 4C
FIG. 4A
FIG. 4B

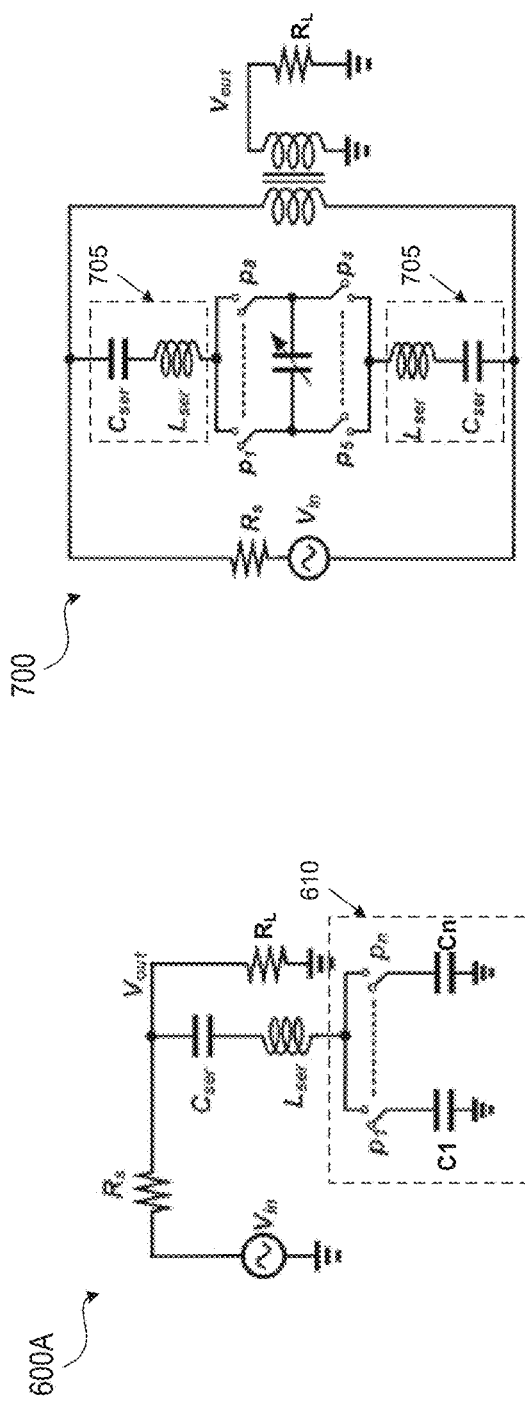
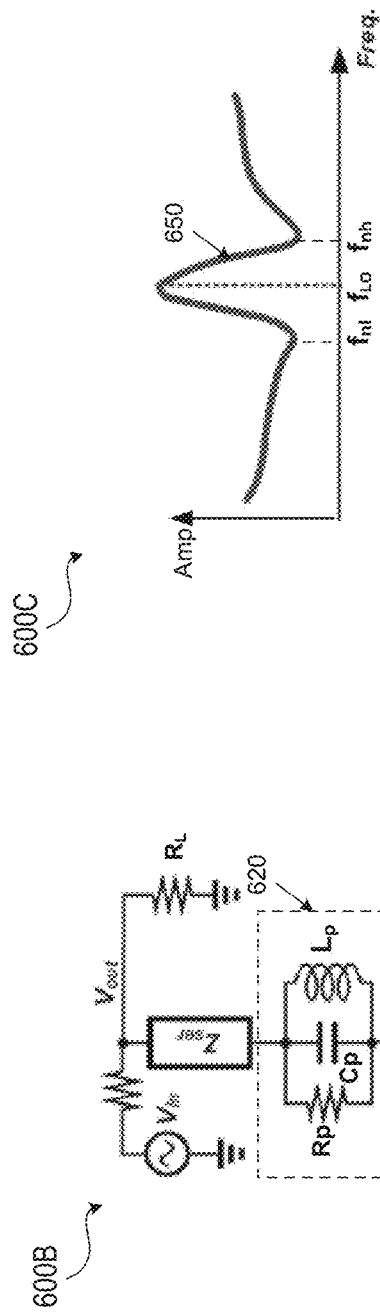

800

Couple one or more first reactive elements between a first filter node and a first node
(810)

↓

Couple a multi-branch circuit between the first node and a second node, the multi-branch circuit includes multiple parallel branches, and a branch of the multi-branch circuit includes at least a switch coupled to a variable capacitor
(820)

↓

Adjust a capacitance of the variable capacitor to tune a notch frequency of the notch filter circuit
(830)

LINEAR, LOW NOISE, HIGH Q AND WIDELY TUNABLE NOTCH FILTER

TECHNICAL FIELD

The present description relates generally to integrated circuits, and more particularly, to a linear, low noise, high quality factor (Q) and widely tunable notch filter.

BACKGROUND

Blockers are unwanted signals that can interfere with and adversely affect the performance of communication receivers. Blocker can be in-band or out-of-band blockers and may disturb the receiver in different ways. For example, an in-band blocker can desensitize the receiver due to reciprocal or spurious mixing, or through inter-modulation. Whereas a large out-of-band blocker can saturate the receiver front-end, and hence reduces the receiver gain, which may result in elevation of the noise contribution of the subsequent baseband blocks.

In today's densely congested wireless spectrum, design of blocker-tolerant receivers is crucial in achieving a decent performance. Existing solution may utilize multitude of off-chip filters such as surface acoustic wave (SAW) and/or bulk acoustic wave (BAW) filters that are costly and may have large form-factors. On the other hand, co-existence of difference wireless protocols is an important issue in modern hand-held communication devices such as mobiles phones. Many hand-held communication devices use both wireless local area network 2G (WLAN2G) and Bluetooth transceivers, the industrial, scientific and medical (ISM) band for which is quite close to the long-term evolution (LTE) band. For example, the co-existence of the unwanted LTE signals can degrade the performance of WLAN2G. The out-of-band (OOB) noise of the WLAN2G transmitter can leak into the input of the LTE receiver, and has to be significantly less than a noise floor of the LTE receiver. Typically, the antenna for WLAN2G and cellular band is shared.

Currently, in order to reduce the OOB noise of the WLAN2G in the LTE band to a negligible level, an inter-stage SAW filter is added between the power amplifier (PA) and the PA driver (PAD). An existing large body of research for mitigation of receiver (RX) band noise in frequency-division duplexing (FDD) systems is mostly focused on baseband (BB). For example, low noise BB designs and more filtering (e.g., active and/or passive) in BB domain to reduce the digital-to-analog converter (DAC) and BB noise has been the focus of some of these research projects. The low noise BB designs may be most problematic as the noise at the BB includes noise contribution from most amplification stages. Use of passive-mixers instead of active-mixers has also been considered to reduce the noise and non-linearity contributions from the active-mixers.

BRIEF DESCRIPTION OF THE DRAWINGS

Certain features of the subject technology are set forth in the appended claims. However, for purposes of explanation, several embodiments of the subject technology are set forth in the following figures.

FIGS. 3A-3B are schematic diagrams illustrating examples of a differential notch filter circuit and a corresponding multipath switched-capacitor circuit, according to aspects of the subject technology.

FIGS. 4A through 4C are schematic diagrams and a chart illustrating an example of a notch filter circuit, a corresponding equivalent circuit model and a frequency response, according to aspects of the subject technology.

FIG. 5 is a schematic diagram illustrating an example of a differential notch filter circuit, according to aspects of the subject technology.

FIGS. 6A through 6C are schematic diagrams and a chart illustrating an example of a notch filter circuit, a corresponding equivalent circuit model and a frequency response, according to aspects of the subject technology.

FIG. 7 is a schematic diagram illustrating an example of a differential notch filter circuit, according to aspects of the subject technology.

FIG. 8 is flow diagram illustrating a method of providing a notch filter, according to aspects of the subject technology.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects of the subject technology, methods and configurations are described for providing a linear, low noise, high quality factor (Q) and widely tunable notch filter. The subject technology does not use bulky and expensive off-chip filters that are used in most many existing solutions. The notch filter of the subject technology is a shunt N-path notch filter, featuring linearity and narrow-band filtering at radio-frequency (RF). The center frequency of the disclosed notch filter is tunable with local oscillator (LO) frequency. The location of the notch frequency with respect to the LO frequency is readily tunable with changing a capacitance value of a capacitor of the filter. Because the circuit is in shunt mode, it can be easily turned off and disconnected, as needed. In some implementations, the notch filter of the subject technology includes a series inductor and capacitor that can be bypassed to enable the band-pass filter (BPF) mode of operation. The circuit for the disclosed notch filter includes switches and passive components and therefore it can operate as a linear filter.

Figure 1A:
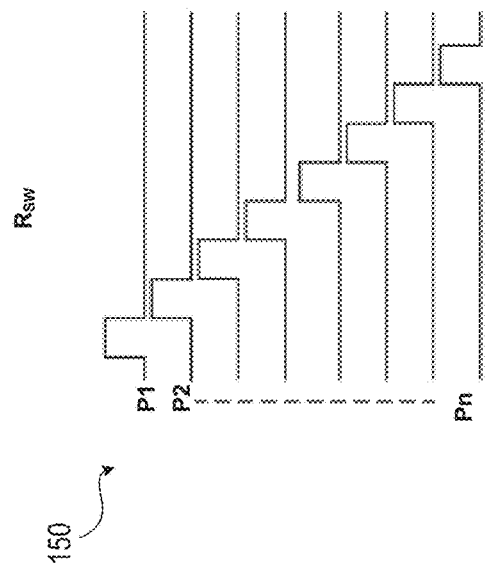
FIGS. 1A-1B are a schematic diagram and a timing diagram illustrating an example of a notch filter circuit and corresponding clock pulses, according to aspects of the subject technology.
Figure 1B:
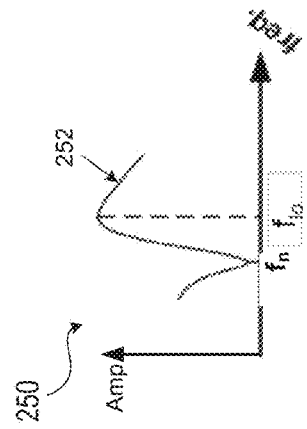

FIGS. 1A-1B are a schematic diagram and a timing diagram illustrating an example of a notch filter circuit 100 and corresponding clock pulses 150, according to aspects of the subject technology. The notch filter circuits 100 shown in FIG. 1A represents a linear, high Q and widely tunable notch filter. The notch filter circuits 100 includes a serial reactive element, which in the embodiment of FIG. 1A is serial capacitor $C_{ser}$, and a multi-branch circuit 110, coupled to a load resistor $R_L$ and a signal source modeled using a signal voltage source $V_{in}$ and a source resistor $R_s$. The serial capacitor $C_{ser}$ is coupled between a first filter node 102 and a first node 104, and the multi-branch circuit 110 is coupled between the first node 104 and a second node, which in the embodiment of FIG. 1A, is the ground potential.

Each branch of the multi-branch circuit 110 includes a switch S (e.g., S1 . . . Sn) coupled to a variable capacitor C (e.g., C1 . . . Cn). The switches S of the multi-branch circuit 110 are controlled by a series of clock pulses 150 including clock pulses P1 . . . Pn. For example, a clock pulse P1 controls a switch S1 and a clock pulse Pn controls a switch Sn. The clock pulses 150 are consecutive pulses with different phases (e.g., delays). In some implementations, the delays are approximately equal to a width of each clock pulse, such that the switches S are closed in a consecutive order. The clock frequency may be the same as the frequency of a local oscillator (LO) (e.g., about 2.4 GHz) of, for example, a transmit path that the notch filter 100 is used in. The notch filter 100 can be implemented to have a pole at the LO frequency ($f_{LO}$) to boost the gain of the filter.

Figure 2A:
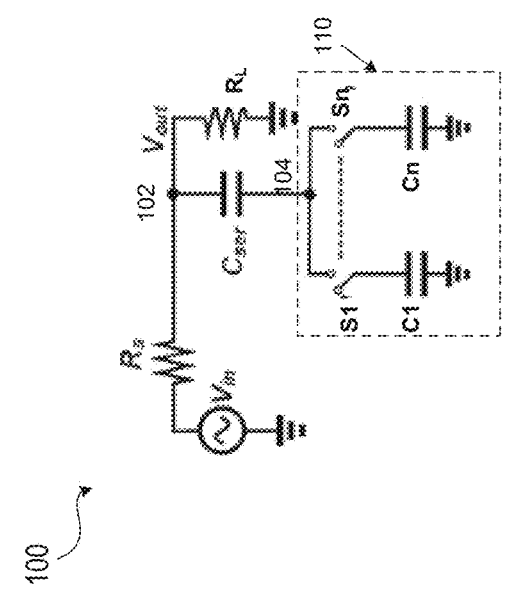
FIGS. 2A-2B are a schematic diagram and a chart illustrating an example of an equivalent circuit model of the notch filter circuit of FIG. 1 and a corresponding frequency response, according to aspects of the subject technology.
Figure 2B:
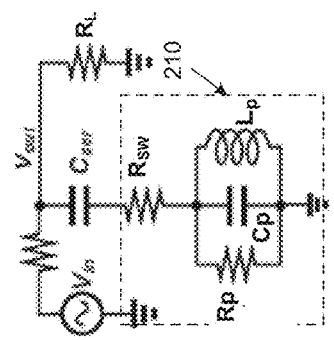

FIGS. 2A-2B are a schematic diagram and a chart illustrating an example of an equivalent circuit model 200 of the notch filter circuit 100 of FIG. 1 and a corresponding frequency response 250, according to aspects of the subject technology. In the equivalent circuit model 200 shown in FIG. 2A, the multi-branch circuit 110 of FIG. 1A is modeled with a parallel LC tank 210 formed of an inductor Lp, a capacitor Cp and a resistor Rp, and a series resistor $R_{SW}$ (e.g., associated with the switches S of FIG. 1). The equivalent circuit model 200 has a conjugate pole at $f_{LO}$ and a zero at $1/\sqrt{(Cp+C_{ser})Lp}$. The frequency response 250 shows a plot 252 of amplitude versus frequency of the notch filter 100 based on the equivalent circuit model 200. The frequency response 250 indicates a maximum corresponding to the pole located at $f_{LO}$ and a minimum corresponding to the zero at the notch frequency ($f_n$) (e.g., $1/\sqrt{(Cp+C_{ser})Lp}$). It is understood that Cp in the equivalent circuit model 200 includes a contribution from the capacitors C (e.g., C1 . . . Cn) of FIG. 1A, which can be variable capacitors. Therefore, the notch frequency ($f_n$) that depends on Cp is tunable by adjusting the variable capacitance C.

FIGS. 3A-3B are schematic diagrams illustrating examples of a differential notch filter circuit 300 and a corresponding multipath switched-capacitor circuit 310, according to aspects of the subject technology. The notch filter 100 of FIG. 1 was a single ended implementation of the linear tunable notch filter of the subject technology. The differential implementation is shown by the differential notch filter circuit 300, which includes a first serial reactive element, which in the embodiment of FIG. 3A is the serial capacitor $C_{ser}$, a second serial capacitor $C_{ser}$, and a multi-branch circuit 310, coupled to a load resistor $R_L$ and a signal source that is modeled using the signal voltage source $V_{in}$ and the source resistor $R_s$. The coupling to the load resistor $R_L$ is through a transformer 320. The first serial capacitor $C_{ser}$ is coupled between a first filter node 302 and a first node 304.

The multi-branch circuit 310 is coupled between the first node 304 and a second node 306, and the second serial capacitor $C_{ser}$ is coupled between the second node 306 and a second filter node 308. The first filter node 302 and the second filter node 308 are connected to a primary coil of the transformer 320. A secondary coil of the transformer 320 is connected to the load resistor $R_L$ at one end and to the ground potential at the other end of the secondary coil. The multi-branch circuit 310, as shown in more detail in FIG. 3B, includes switches S1, S2 . . . S8 and capacitors C1, C2 . . . C4. Each capacitor C (e.g., C1) is coupled between two parallel branches of switches, as shown in the section 330 that includes capacitor C1 and switches S1, and S5. The switches S1, S2 . . . S8 are controlled by a multiphase sequence of clock pulses, such as the clock pulses 150 of FIG. 1B described above. For example, the first clock pulse (e.g., P1 of FIG. 1B) closes switch S1 that allows capacitor C1 to be serially connected to the first and second serial capacitors $C_{ser}$. In other words the capacitor Cp of the equivalent circuit model 200 of FIG. 2A would be equivalent to C1+2 $C_{ser}$. Similarly the fifth clock pulse (e.g., P5 of FIG. 1B) closes switch S5 that allows capacitor C1 to be serially connected to the first and second serial capacitors $C_{ser}$ again. However, the direction of current through the closed path 314 may be different from the closed path 312 formed when switch S1 was closed by the clock pulse P1. The operation of the switches in sections 340 and 350 are similar to the section 330. It is understood that the number of parallel branches (e.g., sections 330, 340 and 350) is not limited to 4 branches (e.g., sections) shown in FIGS. 3A and 3B and can be other numbers (e.g., 8, 16, etc.).

The clock frequency is the same as the frequency of a local oscillator (LO) (e.g., about 2.4 GHz) of, for example, a transmit path that the differential notch filter 300 is used in. The differential notch filter 300 can be implemented to have a pole at the LO frequency ($f_{LO}$) to boost the gain of the filter.

FIGS. 4A through 4C are schematic diagrams and a chart illustrating an example of a notch filter circuit 400A, a corresponding equivalent circuit model 400B and a frequency response 400C, according to aspects of the subject technology. The notch filter circuit 400A is similar to the notch filter 100 of FIG. 1A, except that the reactive element in the implementation of FIG. 4A is a serial inductor $L_{ser}$. For example, the multi-branch circuit 410 is similar to the multi-branch circuit 110 of FIG. 1A. The multi-branch circuit 410 can be molded by the parallel LC tank 420 of the equivalent circuit model 400B, as discussed above with respect to the LC tank 210 of FIG. 2A. The equivalent circuit model 400B has a conjugate pole at $f_{LO}$ and a zero at $1/\sqrt{(LpCp)/L_{ser}}$.

The frequency response 400C shows a plot 450 of amplitude versus frequency of the notch filter 400 based on the equivalent circuit model 400B. The frequency response 400C indicates a maximum corresponding to the pole located at $f_{LO}$ and a minimum corresponding to the zero at the notch frequency ($f_n$) (e.g., $1/\sqrt{(LpCp)/L_{ser}}$). It is understood that Cp in the equivalent circuit model 400B includes a contribution from the capacitors C (e.g., C1 . . . Cn) of FIG. 4A, which can be variable capacitors. Therefore, the notch frequency ($f_n$) that depends on Cp is tunable by adjusting the variable capacitance C (e.g., C1 . . . Cn).

FIG. 5 is a schematic diagram illustrating an example of a differential notch filter circuit 500, according to aspects of the subject technology. The notch filter 400A of FIG. 4A is a single ended implementation of the linear tunable notch filter of the subject technology. The differential implementation is shown by the differential notch filter circuit 500, which is similar to the differential notch filter circuit 300 of FIG. 3, except that the first and second reactive elements, in the implementation of FIG. 5, are serial inductors $L_{ser}$, which replace the serial capacitors $C_{ser}$ of FIG. 3. For example, the multi-branch circuit 510 is similar to the multi-branch circuit 310 FIG. 3 and is coupled to the load resistor $R_L$ through a transformer 520 similar to the transformer 320 of FIG. 3. The detail of the multi-branch circuit 510 is similar to the multi-branch circuit 310, as shown FIG. 3B, and includes switches S1, S2 . . . S8 and capacitors C1, C2 . . . C4, and the switches S1, S2 . . . S8 are controlled by a multiphase sequence of clock pulses, such as the clock pulses 150 of FIG. 1B, as described above. For example, the first clock pulse (e.g., P1 of FIG. 1B) closes switch S1 that allows capacitor C1 to be serially connected to the first and second serial inductors $L_{ser}$. The clock frequency is the same as the frequency of a local oscillator (LO) (e.g., about 2.4 GHz) of, for example, a transmit path that the differential notch filter 500 is used in. The differential notch filter 500 can be implemented to have a pole at the LO frequency ($f_{LO}$) to boost the gain of the filter.

FIGS. 6A through 6C are schematic diagrams and a chart illustrating an example of a notch filter circuit 600A, a corresponding equivalent circuit model 600B and a frequency response 600C, according to aspects of the subject technology. The notch filter circuit 600A is similar to the notch filter 100 of FIG. 1A, except that the reactive element in the implementation of FIG. 6A is a series combination of the serial capacitor $C_{ser}$ and the serial inductor $L_{ser}$ and the notch filter circuit 600A is a double-notch filter. For example, the multi-branch circuit 610 is similar to the multi-branch circuit 410 of FIG. 4A.

The multi-branch circuit 610 can be molded by the parallel LC tank 620 of the equivalent circuit model 600B of FIG. 6B. The equivalent circuit model 600B includes the serial impedance $Z_{ser}$ that is equal to sum of the reactance of the serial capacitor $C_{ser}$, the serial inductor $L_{ser}$ and the switch resistance ($R_{sw}$). It is understood that the serial impedance $Z_{ser}$ is capacitive for operating frequencies ($f_{in}$) smaller than $f_{LO}$ and is inductive for $f_{in}$ larger than $f_{LO}$.

As shown in frequency response 600C of FIG. 6C, the plot 650 of amplitude versus frequency of the notch filter 600A, which is based on the equivalent circuit model 400B, depicts a maximum corresponding to the pole located at $f_{LO}$ and two minima corresponding to zeros at the low and high notch frequencies ($f_{n1}$ and $f_{nh}$). The notch frequencies ($f_{n1}$ and $f_{nh}$) are tunable by adjusting the variable capacitance C (e.g., C1 . . . Cn) of FIG. 6A.

FIG. 7 is a schematic diagram illustrating an example of a differential notch filter circuit 700, according to aspects of the subject technology. The notch filter 600A of FIG. 6A was a single ended implementation of the tunable double-notch filter of the subject technology. The differential implementation is shown by the differential notch filter circuit 700, which is a double notch filter. The differential notch filter circuit 700 is similar to the differential notch filter circuit 500 of FIG. 5, except that the first and second reactive elements, in the implementation of FIG. 7, are series combination 705 of the serial capacitor $C_{ser}$ and serial inductors $L_{ser}$, which, for example, replaces the serial inductors $L_{ser}$ of FIG. 5. Further description of the differential notch filter circuit 700 is similar to the descriptions provided with respect to FIG. 5 and is skipped here for brevity.

FIG. 8 is flow diagram illustrating a method 800 of providing a notch filter, according to aspects of the subject technology. For explanatory purposes, the method 800 is primarily described herein with reference to the notch filter circuits 100 of FIG. 1A and 400A of FIG. 4A. However, the method 800 is not limited to the notch filter circuits 100 and 400A, and one or more blocks (or operations) of the method 800 may be performed by one or more other components of the notch filter circuits 100 and 400A. Further for explanatory purposes, the blocks of the example method 800 are described herein as occurring in serial, or linearly. However, multiple blocks of the example method 800 may occur in parallel. In addition, the blocks of the example method 800 need not be performed in the order shown and/or one or more of the blocks of the example method 800 need not be performed.

The method 800 includes coupling one or more first reactive elements (e.g., $C_{ser}$ of FIG. 1A or $L_{ser}$ of FIG. 4A) between a first filter node (e.g., 102 of FIG. 1) and a first node (e.g., 104 of FIG. 1) (810). The method further includes coupling a multi-branch circuit (e.g., 110 of FIG. 1) between the first node and a second node (e.g., Ground in FIG. 1 or 306 of FIG. 3), the multi-branch circuit including multiple parallel branches, and a branch of the multi-branch circuit including at least a switch (e.g., any one of S1 . . . Sn of FIG. 1) coupled to a variable capacitor (e.g., any one of C1 . . . Cn of FIG. 1) (820). A capacitance of the variable capacitor may be adjusted to tune a notch frequency (e.g., $f_n$ of FIG. 2B) of the notch filter circuit (830).

Figure 9:
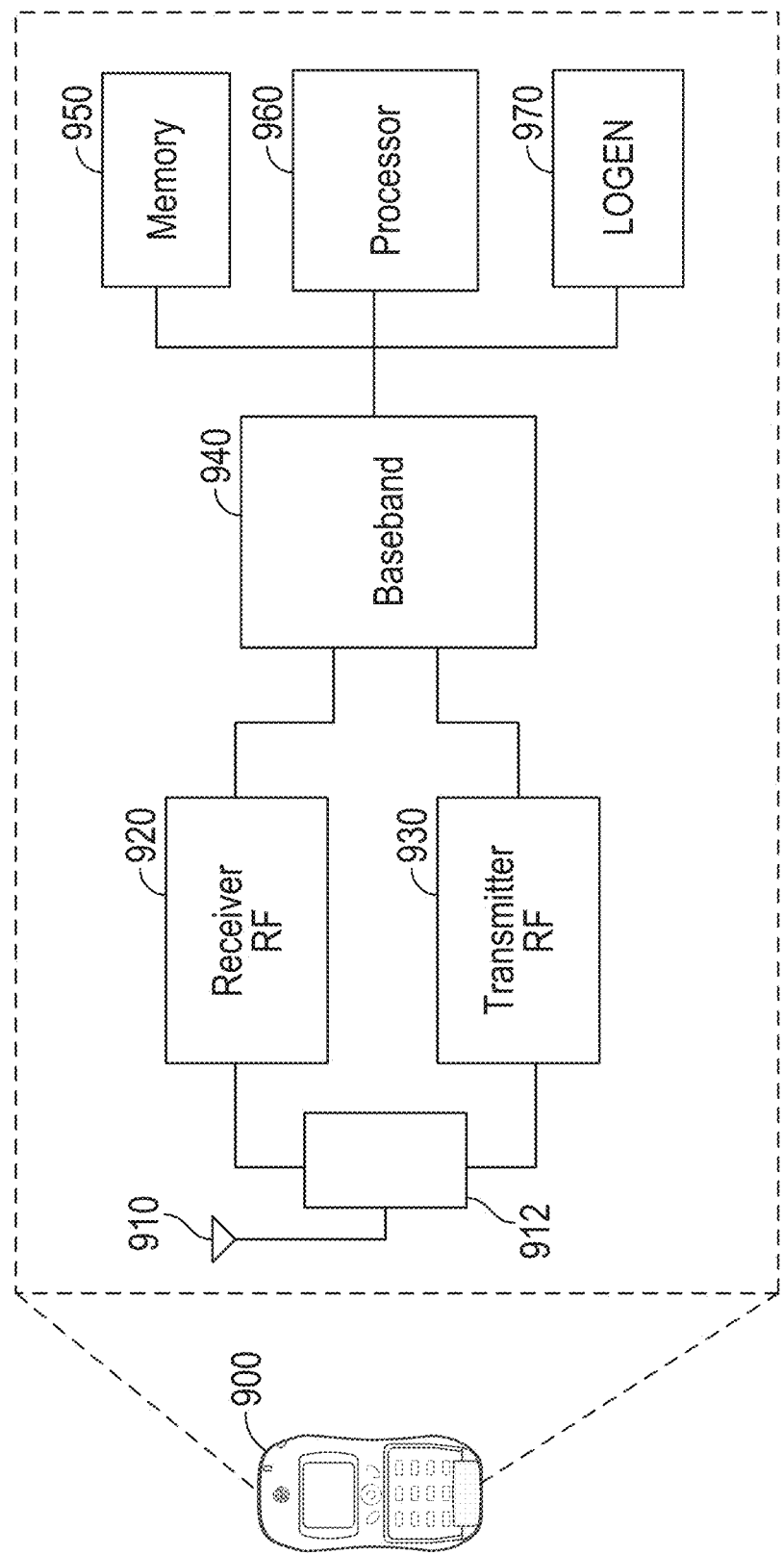
FIG. 9 is a block diagram illustrating an example wireless communication device in accordance with one or more implementations of the subject technology.

FIG. 9 is a block diagram illustrating an example wireless communication device 900 in accordance with one or more implementations of the subject technology. Not all of the depicted components may be used in all implementations; however, one or more implementations may include additional or different components than those shown in the figure. Variations in the arrangement and type of the components may be made without departing from the spirit or scope of the claims as set forth herein. Additional components, different components, or fewer components may be provided.

The wireless communication device 900 may comprise a radio-frequency (RF) antenna 910, a receiver 920, a transmitter 930, a baseband processing module 940, a memory 950, a processor 960, and a local oscillator generator (LO-GEN) 970. In various embodiments of the subject technology, one or more of the blocks represented in FIG. 9 may be integrated on one or more semiconductor substrates. For example, the blocks 920-970 may be realized in a single chip or a single system on chip, or may be realized in a multi-chip chipset.

The RF antenna 910 may be suitable for transmitting and/or receiving RF signals (e.g., wireless signals) over a wide range of frequencies (e.g., 60 GHz band). Although a single RF antenna 910 is illustrated, the subject technology is not so limited.

The receiver 920 may comprise suitable logic circuitry and/or code that may be operable to receive and process signals from the RF antenna 910. The receiver 920 may, for example, be operable to amplify and/or down-convert received wireless signals. In various embodiments of the subject technology, the receiver 920 may be operable to cancel noise in received signals and may be in close proximity to over a wide range of frequencies. In this manner, the receiver 920 may be suitable for receiving signals in accordance with a variety of wireless standards. Wi-Fi, WiMAX, Bluetooth, and various cellular standards. In various embodiments of the subject technology, the receiver 920 may not require any SAW filters and few or no off-chip discrete components such as large capacitors and inductors.

The transmitter 930 may comprise suitable logic circuitry and/or code that may be operable to process and transmit signals from the RF antenna 910. The transmitter 930 may, for example, be operable to up-convert baseband signals to RF signals and amplify RF signals. In various embodiments of the subject technology, the transmitter 930 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 930 may be operable to provide signals for further amplification by one or more power amplifiers.

The duplexer 912 may provide isolation in the transmit band to avoid saturation of the receiver 920 or damaging parts of the receiver 920, and to relax one or more design requirements of the receiver 920. Furthermore, the duplexer 912 may attenuate the noise in the receive band. The duplexer may be operable in multiple frequency bands of various wireless standards.

The baseband processing module 940 may comprise suitable logic, circuitry, interfaces, and/or code that may be operable to perform processing of baseband signals. The baseband processing module 940 may, for example, analyze received signals and generate control and/or feedback signals for configuring various components of the wireless communication device 900 such as the receiver 920. The baseband processing module 940 may be operable to encode, decode, transcode, modulate, demodulate, encrypt, decrypt, scramble, descramble, and/or otherwise process data in accordance with one or more wireless standards.

The processor 960 may comprise suitable logic, circuitry, and/or code that may enable processing data and/or controlling operations of the wireless communication device 900. In this regard, the processor 960 may be enabled to provide control signals to various other portions of the wireless communication device 900. The processor 960 may also control transfers of data between various portions of the wireless communication device 900. Additionally, the processor 960 may enable implementation of an operating system or otherwise execute code to manage operations of the wireless communication device 900.

The memory 950 may comprise suitable logic, circuitry, and/or code that may enable storage of various types of information such as received data, generated data, code, and/or configuration information. The memory 950 may comprise, for example, RAM, ROM, flash, and/or magnetic storage. In various embodiment of the subject technology, Information stored in the memory 950 may be utilized for configuring the receiver 920 and/or the baseband processing module 940.

The local oscillator generator (LOGEN) 970 may comprise suitable logic, circuitry, interfaces, and/or code that may be operable to generate one or more oscillating signals of one or more frequencies. The LOGEN 970 may be operable to generate digital and/or analog signals. In this manner, the LOGEN 970 may be operable to generate one or more clock signals and/or sinusoidal signals. Characteristics of the oscillating signals such as the frequency and duty cycle may be determined based on one or more control signals from, for example, the processor 960 and/or the baseband processing module 940.

In operation, the processor 960 may configure the various components of the wireless communication device 900 based on a wireless standard according to which it is desired to receive signals. Wireless signals may be received via the RF antenna 910 and amplified and down-converted by the receiver 920. The baseband processing module 940 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 950, and/or information affecting and/or enabling operation of the wireless communication device 900. The baseband processing module 940 may modulate, encode and perform other processing on audio, video, and/or control signals to be transmitted by the transmitter 930 in accordance to various wireless standards.

In some embodiments, a PA of the RF transmitter 930 can be coupled to a PA driver via the notch filter of the subject technology to benefit from the linearity, high Q, wide range of tunability, low noise and other advantageous features of the disclosed technology.

Figure 10:
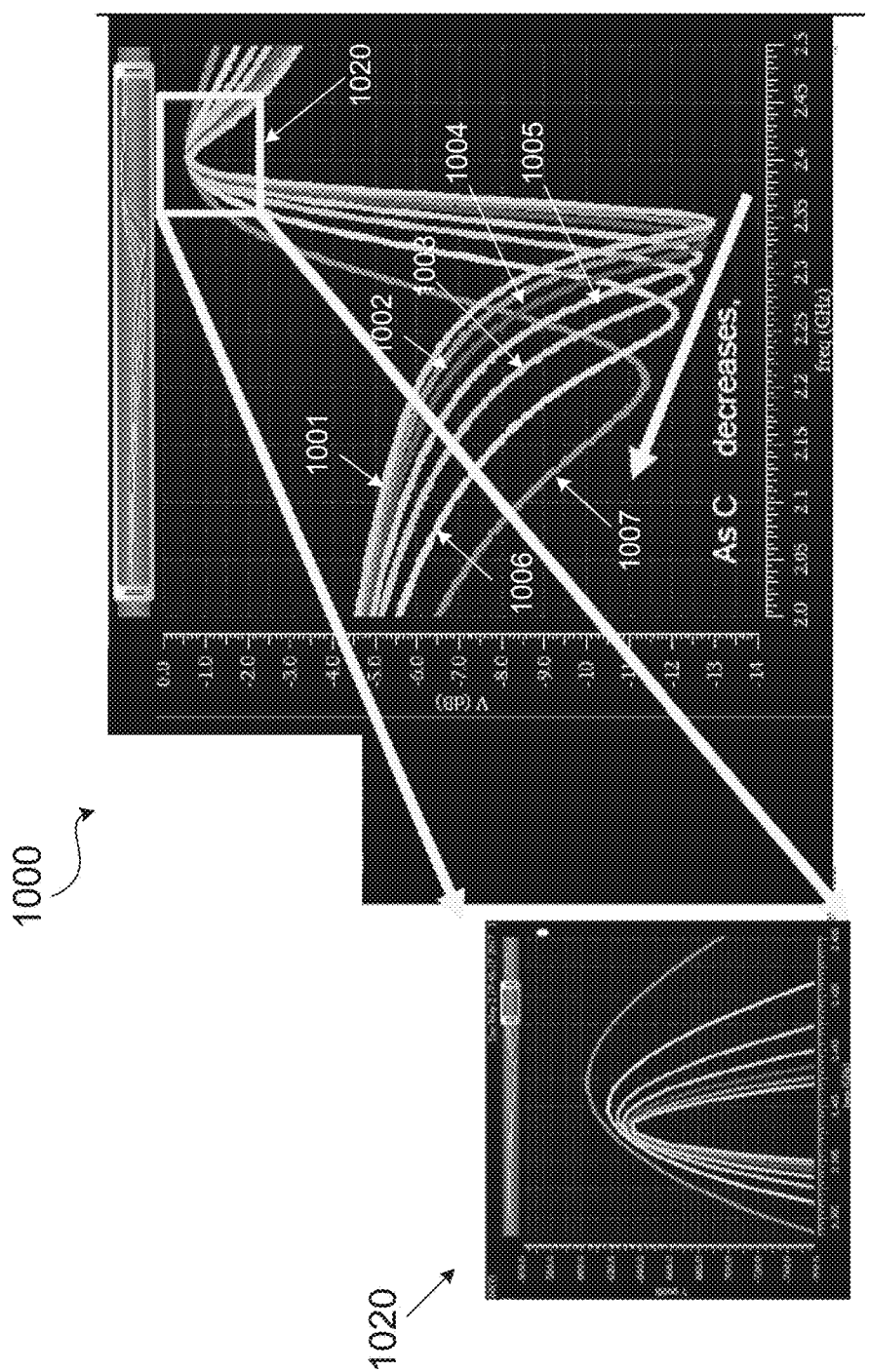
FIG. 10 is a chart illustrating plots of frequency response of a notch filter of the subject technology with variation of a capacitance of a variable capacitor.

FIG. 10 is a chart 1000 illustrating plots of frequency response of a notch filter of the subject technology with variation of a capacitance of a variable capacitor. The chart 1000 shown in FIG. 10 depicts the wide tunability of the notch filter (e.g., 100 of FIG. 1) of the subject technology. As mentioned above the notch frequency of the disclosed filters (e.g., 100) are tunable by changing the capacitance value of the variable capacitor C (e.g., C1 . . . Cn), for example, of FIG. 1A. The plots 1001, 1002 . . . 1007 correspond to different values of the capacitances (e.g., 5, 7, 10, 12.5, 15, 17.5 and 20 pf) of the variable capacitor C. The notch frequencies (e.g., depicted by the minima) of the plots 1001, 1002 . . . 1007 appears to be quite sensitive to the capacitance values and move towards lower frequencies, as the value of the capacitance of the variable capacitor C is increased. Further, the notch depth is seen to insignificantly decrease as the value of the capacitance of the variable capacitor C is increased. This is due to the reduction in Q of the n-path filter. The potion 1020 of the chart 1000 is blown out to indicate the insignificance of the in-band loss of the filter, and that the in-band loss of the filter does not change with changing the value of the capacitance of the variable capacitor C.

Figure 11:
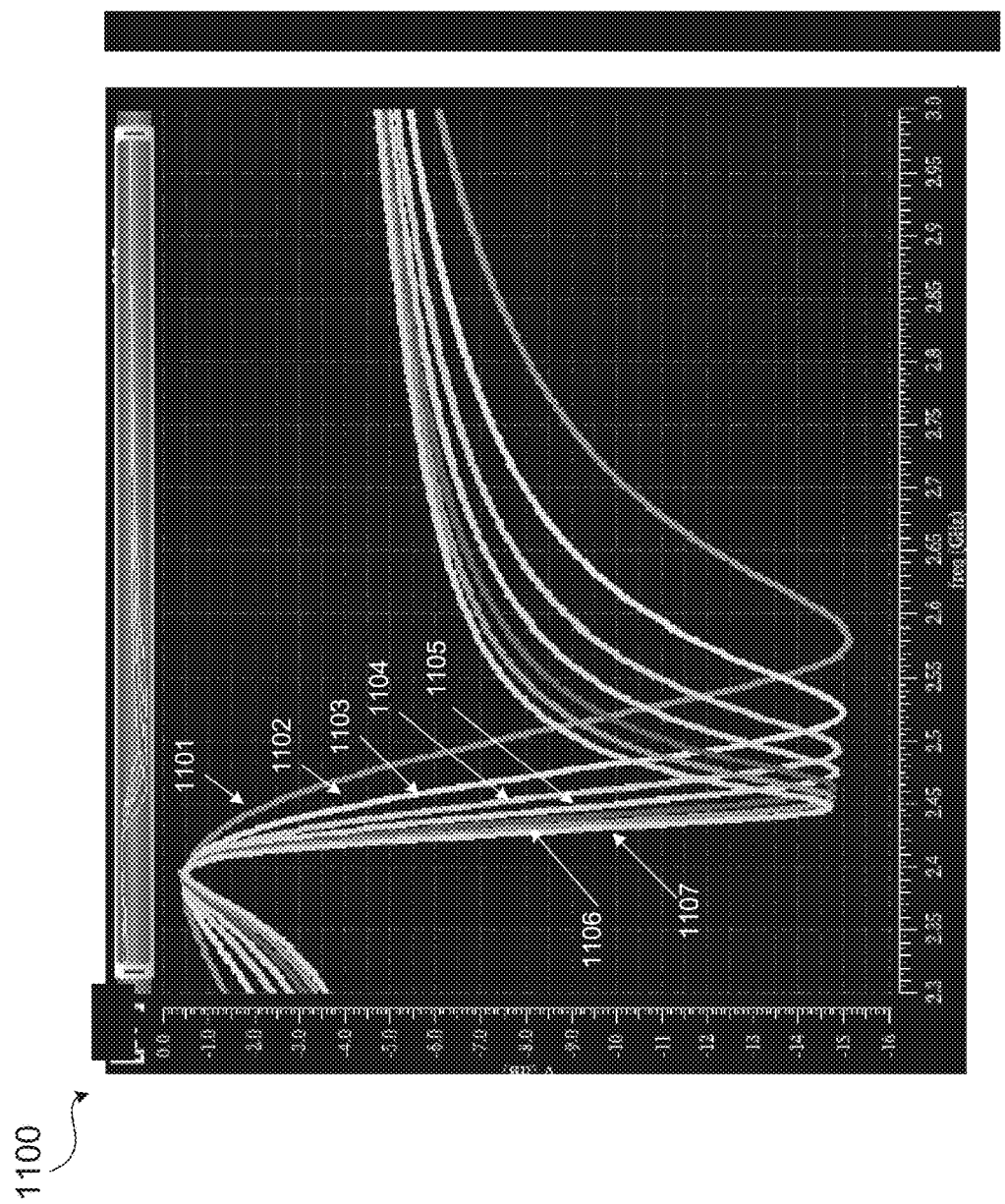
FIG. 11 is a chart illustrating plots of frequency response of a notch filter of the subject technology with variation of a capacitance of a variable capacitor.

FIG. 11 is a chart illustrating plots of frequency response of a notch filter of the subject technology with variation of a capacitance of a variable capacitor. The chart 1100 shown in FIG. 11 depicts the wide tunability of the notch filter (e.g., 400A of FIG. 4A) of the subject technology. As mentioned above the notch frequency of the disclosed filters (e.g., 400A) is tunable by changing the capacitance value of the variable capacitor C (e.g., C1 . . . Cn), for example, of FIG. 4A. The plots 1101, 1102 . . . 1107 correspond to different values of the capacitances (e.g., 5, 7, 10, 12.5, 15, 17.5 and 20 pf) of the variable capacitor C. The notch frequencies (e.g., depicted by the minima) of the plots 1101, 1102 . . . 1107 appears to be quite sensitive to the capacitance values and move towards lower frequencies, as the value of the capacitance of the variable capacitor C is increased. The plots of the chart 1100 correspond to the notch filter 400A, with values of the inductance and Q value of the serial inductor $L_{ser}$ are respectively 2 nH and 10.

Figure 12:
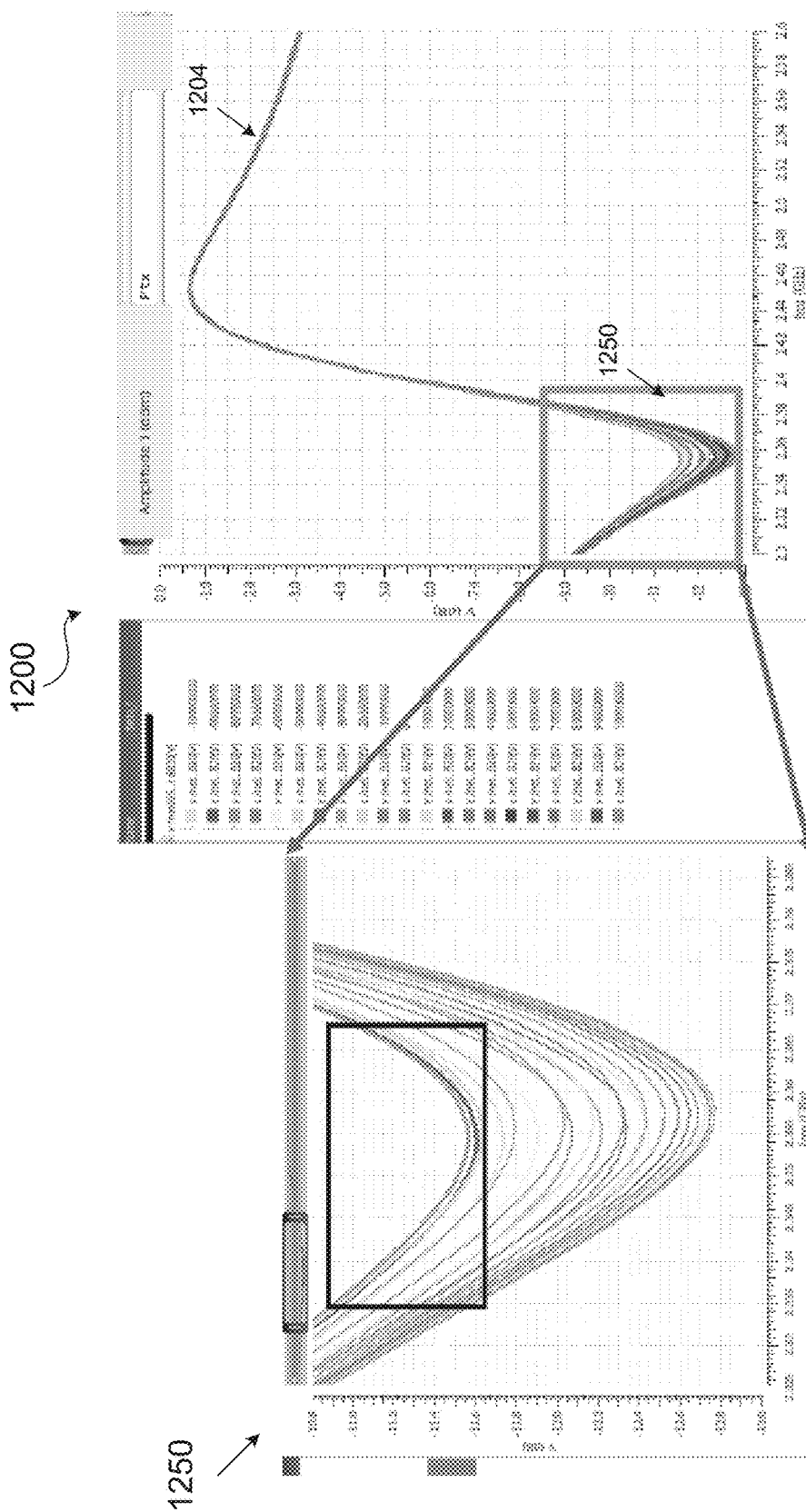
FIG. 12 is a chart illustrating plots of frequency response of a notch filter of the subject technology with variation of a frequency of an in-band blocker signal.

FIG. 12 is a chart illustrating plots of frequency response 1200 of a notch filter of the subject technology with variation of a frequency of an in-band blocker signal. The frequency response 1200 includes a number of plots 1204 corresponding to various values of frequencies of an in-band blocker signal simulated by sweeping an offset frequency (Δf) with respect to $f_{LO}$, from 100 MHz to +100 MHz, while keeping the transmit power at $P_{tx}$=0 dBm. The blown up portion 1250 shows the resilience of the notch filter to rather large in-band blocker signals.

Figure 13:
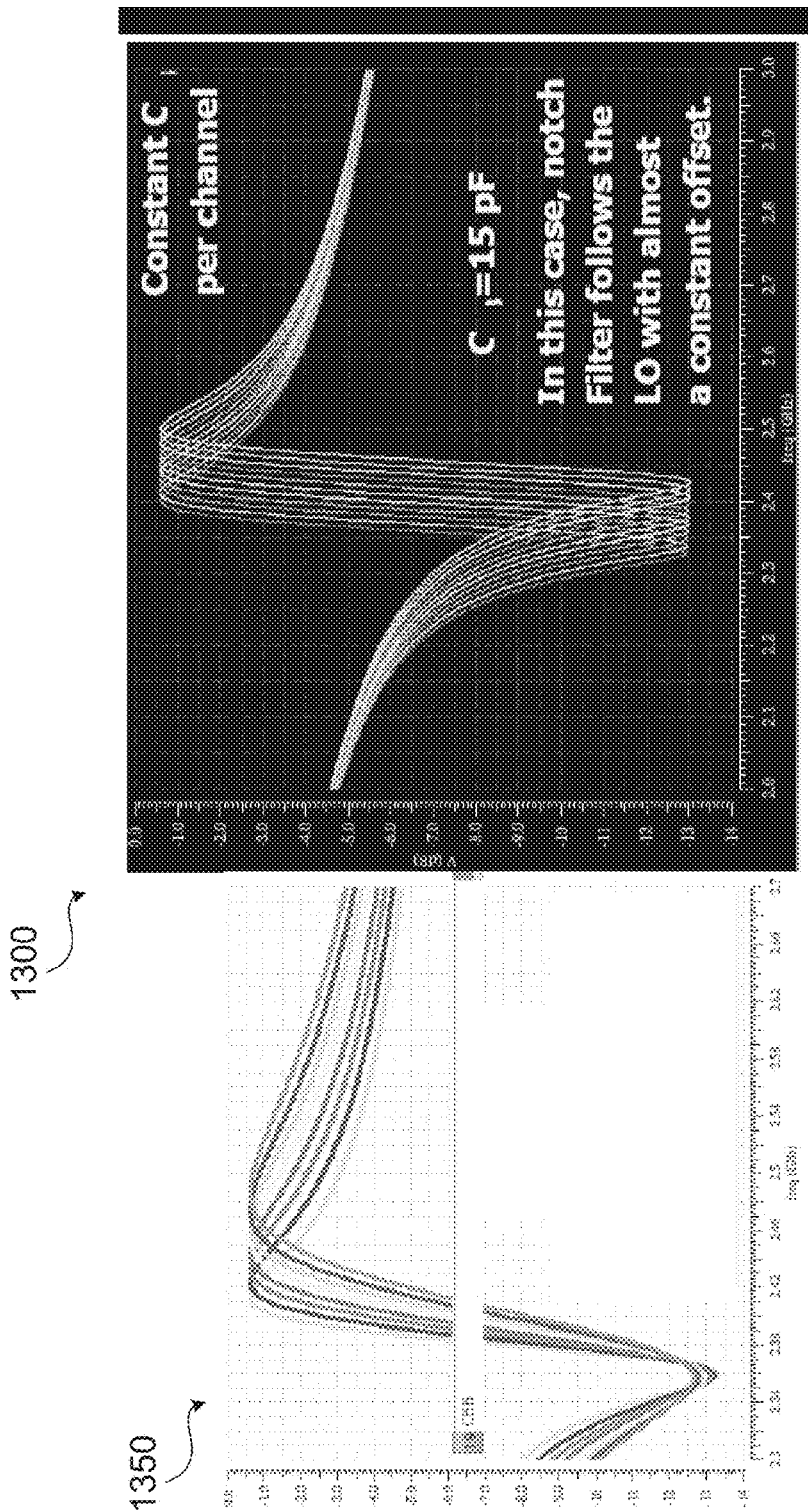
FIG. 13 is a chart illustrating plots of frequency response of a notch filter of the subject technology with variation of a local oscillator frequency.

FIG. 13 is a chart illustrating plots of frequency response 1300 of a notch filter of the subject technology with variation of a local oscillator frequency ($f_{LO}$). The frequency response 1300 shows a number of plots corresponding to various values of the local oscillator frequency ($f_{LO}$). It appears that for a fixed value of the variable capacitor (e.g., C1 . . . Cn of FIG. 1A) the notch frequency (the minima in the plots) follows the change in the $f_{LO}$, which may not be desirable. However, the plots in the chart 1350, which correspond to various values of the capacitance of the variable capacitor C, show the variation of the notch frequency can be stopped, as the $f_{LO}$ is changed, by changing the value of the capacitance of the variable capacitor C. In other words, a notch frequency of the notch filter of the subject technology can be tuned across the 2G band by changing the capacitance value of the variable capacitor C.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A notch filter circuit, the circuit comprising:
one or more first reactive elements coupled between a first filter node and a first node; and
a multi-branch circuit coupled between the first node and a second node,
wherein:
the multi-branch circuit comprise multiple parallel branches,
a branch of the multi-branch circuit comprises at least a switch coupled to a variable capacitor, and
capacitance values of variable capacitors of the multi-branch circuit are configured to be adjusted via multiple consecutive clock pulses to allow tuning a notch frequency of the notch filter circuit.

2. The circuit of claim 1, wherein the switch is configured to be controllable by a clock signal having a clock frequency.

3. The circuit of claim 2, the one or more first reactive elements comprise a capacitor, and the notch frequency is lower than the clock frequency.

4. The circuit of claim 2, wherein the one or more first reactive elements comprise an inductor, and the notch frequency is higher than the clock frequency.

5. The circuit of claim 2, wherein the one or more first reactive elements comprise a capacitor in series with an inductor, and the notch filter circuit comprises a double notch filter having notches at frequencies lower and higher than the clock frequency.

6. The circuit of claim 1, wherein the second node comprises a second filter node and is coupled to a ground potential.

7. The circuit of claim 1, wherein the notch filter circuit comprises a differential notch filter.

8. The circuit of claim 7, wherein the differential notch filter further comprises one or more second reactive elements coupled between the second node and a second filter node, and the differential notch filter is coupled to a load through an output transformer.

9. The circuit of claim 7, wherein the branch of the multi-branch circuit comprises four switches coupled to the variable capacitor.

10. The circuit of claim 9, wherein for each cycle of a differential input signal, two of the four switches are operable to allow a signal current path through the variable capacitor.

11. A method for providing a linear notch filter circuit, the method comprising:
coupling one or more first reactive elements between a first filter node and a first node;
coupling a multi-branch circuit between the first node and a second node, the multi-branch circuit including multiple parallel branches, and a branch of the multi-branch circuit including at least a switch coupled to a variable capacitor; and adjusting capacitance values of variable capacitors of the multi-branch circuit via multiple consecutive clock pulses to tune a notch frequency of the linear notch filter circuit.

12. The method of claim 11, further comprising configuring the switch to be controllable by a clock signal having a clock frequency.

13. The method of claim 12, wherein coupling the one or more first reactive elements comprise coupling a capacitor to allow the notch frequency be lower than the clock frequency.

14. The method of claim 12, wherein coupling the one or more first reactive elements comprise coupling an inductor to allow the notch frequency be higher than the clock frequency.

15. The method of claim 12, wherein coupling the one or more first reactive elements comprise coupling a capacitor in series with an inductor to create two notches at frequencies lower and higher than the clock frequency.

16. The method of claim 11, further comprising coupling the second node as a second filter node to a ground potential.

17. The method of claim 11, wherein the linear notch filter circuit comprises a differential notch filter, and the method further comprises forming the differential notch filter by coupling one or more second reactive elements between the second node and a second filter node, and coupling the differential notch filter to a load through an output transformer.

18. The method of claim 17, further comprising forming the branch of the multi-branch circuit by coupling four switches to the variable capacitor, and for each cycle of a differential input signal operating two of the four switches to allow a signal current path through the variable capacitor.

19. A system, comprising:
a power amplifier (PA) driver coupled to a local oscillator generator; and
a notch filter coupled to an output node of the PA driver, the notch filter comprising:
one or more first reactive elements including at least a capacitor or an inductor; and
a multi-branch switched-capacitor circuit including multiple parallel branches coupled between a first node of the notch filter and a second node,
wherein:
the one or more first reactive elements are coupled between the first node of the notch filter and the multi-branch switched-capacitor circuit,
a branch of the multi-branch switched-capacitor circuit includes at least a switch coupled to a variable capacitor, and
capacitance values of variable capacitors of the multi-branch circuit are configured to be adjusted via multiple consecutive clock pulses to tune a notch frequency of the notch filter.

20. The system of claim 19, wherein the notch filter comprises a differential notch filter, and the branch of the multi-branch switched-capacitor circuit includes four switches coupled to the variable capacitor, and wherein for each cycle of a differential input signal two of the four switches are operable to allow a signal current path through the variable capacitor.

* * * * *